United States Patent
Klapper

(10) Patent No.: US 10,088,509 B2
(45) Date of Patent: Oct. 2, 2018

(54) CHECKING A MULTI-POLE ELECTRICAL CIRCUIT BREAKER

(71) Applicant: Omicron Electronics GmbH, Klaus (AT)

(72) Inventor: Ulrich Klapper, Rankweil (AT)

(73) Assignee: Omicron Electronics GmbH, Klaus (AT)

( * ) Notice: Subject to any disclaimer, the term of this patent is extended or adjusted under 35 U.S.C. 154(b) by 0 days.

(21) Appl. No.: 15/312,090

(22) PCT Filed: Jul. 23, 2015

(86) PCT No.: PCT/EP2015/066885
§ 371 (c)(1),
(2) Date: Nov. 17, 2016

(87) PCT Pub. No.: WO2016/016086
PCT Pub. Date: Feb. 4, 2016

(65) Prior Publication Data
US 2017/0138994 A1  May 18, 2017

(30) Foreign Application Priority Data
Jul. 29, 2014 (AT) .............................. A 50536/2014

(51) Int. Cl.
*G01R 31/02* (2006.01)
*G01R 31/327* (2006.01)
(Continued)

(52) U.S. Cl.
CPC ....... *G01R 27/205* (2013.01); *G01R 31/2827* (2013.01); *G01R 31/3274* (2013.01); *G01R 31/327* (2013.01); *G01R 31/333* (2013.01)

(58) Field of Classification Search
CPC .............. G01R 27/205; G01R 31/3274; G01R 31/327; G01R 31/333; G01R 31/2827
(Continued)

(56) References Cited

U.S. PATENT DOCUMENTS 4,042,894 A * 8/1977 Coleman ............ H01H 71/1027
335/172
5,245,289 A * 9/1993 Rumfield ........... G01R 31/3275
324/424
(Continued)

FOREIGN PATENT DOCUMENTS

EP    1464973 A1   10/2004
EP    2700962 A1    2/2014
(Continued)

OTHER PUBLICATIONS

CIBANO500 3-in-1 Test System for Medium- and High-voltage Circuit Breakers, Jul. 7, 2014, pp. 1-20. https://web.archive.org/web/20140707215038/https://www.omicron.at/fileadmin/user_upload/pdf/literature/CIBANO-500-brochure-ENU.pdf. Updated Version—28 Pages May 2017.*
(Continued)

*Primary Examiner* — Jermele M Hollington
*Assistant Examiner* — Sean Curtis
(74) *Attorney, Agent, or Firm* — Seyfarth Shaw LLP; Brian Michaelis

(57) ABSTRACT

The present method relates to a method for checking a multi-pole electrical circuit breaker. The multi-pole electrical circuit breaker comprises a plurality of poles (101-103). Each of the plurality of poles (101-103) comprises a first connection (121-123) and a second connection (131-133). Closing the particular pole (101-103) makes it possible to electrically connect the first connection (121-123) of the particular pole (101-103) to the second connection (131-
(Continued)

133) of the particular pole (101-103) via the pole. In the method, a plurality of micro-ohm measurements are carried out at the plurality of poles (101-103), while the plurality of poles (101-103) are earthed on both sides in a P-P-P-E configuration. A contact resistance of one of the plurality of poles (101-103) is determined on the basis of the plurality of micro-ohm measurements.

11 Claims, 1 Drawing Sheet

(51) Int. Cl.
*G01R 27/20* (2006.01)
*G01R 31/28* (2006.01)
*G01R 31/333* (2006.01)

(58) Field of Classification Search
USPC .......................................... 324/424
See application file for complete search history.

(56) References Cited

U.S. PATENT DOCUMENTS

| | | | |
|---|---|---|---|
| 6,563,406 B2 * | 5/2003 | Beatty | H01H 71/1045 335/147 |
| 9,063,191 B2 * | 6/2015 | Whisenand | G01R 31/1272 |
| 9,547,044 B2 * | 1/2017 | Klapper | G01R 27/205 |
| 2013/0221973 A1 * | 8/2013 | Whisenand | G01R 31/1272 324/501 |
| 2013/0300423 A1 * | 11/2013 | Klapper | G01R 31/3272 324/424 |
| 2013/0300424 A1 * | 11/2013 | Klapper | G01R 31/3274 324/424 |
| 2014/0055142 A1 * | 2/2014 | Klapper | G01R 27/205 324/421 |
| 2015/0323604 A1 * | 11/2015 | Klapper | G01R 27/205 324/424 |
| 2017/0082690 A1 * | 3/2017 | Klapper | G01R 31/3274 |
| 2017/0138994 A1 * | 5/2017 | Klapper | G01R 27/205 |
| 2017/0139009 A1 * | 5/2017 | Klapper | G01R 31/3272 |

FOREIGN PATENT DOCUMENTS

| | | | | |
|---|---|---|---|---|
| JP | H0682536 A | | 3/1994 | |
| WO | WO 2016016086 A1 * | 2/2016 | ......... | G01R 31/3274 |

OTHER PUBLICATIONS

CIBANO500 3-in-1 Test System for Medium- and High-voltage Circuit Breakers, Jul. 7, 2014, pp. 1-20. https ://web. archive, org/web/20140707215038/https ://www.omicron.at/fileadmin/user_upload/pdf/literature/CIBANO-500-brochure-ENU.pdf. Updated Version—28 Pages May 2017.*
CIBANO500 3-in-1 Test System for Medium- and High-voltage Circuit Breakers, Jul. 7, 2014, pp. 1-20. https://web.archive.org/web/20140707215038/https://www.omicron.at/fileadmin/user_upload/pdf/literature/CIBANO-500-brochure-ENU.pdf. Downloaded on Sep. 29, 2015.
Taneja, Adiya et al. Circuit Breaker Testing Complexities Removed, User Convention 2013, Omicron Electronics, Jan. 1, 2013, pp. 1-4. http://www.seeei.org/EL2013/Article/109-ART.pdf. Downloaded on Sep. 29, 2015.
International Search Report of PCT/EP2015/066885, dated Oct. 13, 2015.

* cited by examiner

CHECKING A MULTI-POLE ELECTRICAL CIRCUIT BREAKER

CROSS-REFERENCE TO RELATED APPLICATIONS

This application is a National Stage Application of PCT Appl. No. PCT/EP2015/066885, filed Jul. 23, 3015 which claims benefit of Austrian Application No. A50536/2014 filed Jul. 29, 2014, the entirety of which is incorporated herein by reference.

TECHNICAL FIELD

The present invention relates to a method and a measuring device for testing a multi-pole electrical circuit breaker, in particular carrying out micro-ohm measurements at multi-pole power switches or circuit breakers while these are earthed on both sides.

BACKGROUND

Power switches, circuit breakers, isolators and earth switches are central components in electrical switching systems and are maintained and checked at regular intervals to ensure they function correctly. In energy engineering plants, for example, power generation plants such as power stations or power transmission plants, circuit breakers switch not only operating currents, but also overload currents or short-circuit currents in the event of faults. Circuit breakers can be used both to switch on these currents and to switch off the currents. Preferably, the circuit breakers have extremely low contact resistance in a closed state in order to prevent unnecessary heating up of the circuit breaker and in the event of a residual current in which some ten kiloamps can flow, conduct safely and not overheat. Multi-pole circuit breakers are used to switch multi-phase currents. Each pole in the multi-pole circuit breaker switches one of the plurality of phases and comprises one or more switching contacts switched in series, so-called interrupters or interruption units. A switch in a three-phase network thus comprises three poles, each of which can again comprise one or more interrupters in series.

When testing a switch of this type, for example a circuit breaker, this is opened first and then separated from the rest of the system by means of separators and finally all the poles of the switch are earthed on both sides. There are two routine procedures when earthing a multi-pole switch, for example a multi-pole circuit breaker. It is common in large parts of Europe, for example, to directly connect each pole to earth individually on both sides by means of a corresponding grounding cable. In the USA, however, it is common to earth a first pole on both sides by means of corresponding grounding cables and then to connect the first pole to a second pole on both sides and then to connect the second pole to the third pole on both sides. This type of earth connection is also known as P-P-P-E. Regardless of the type of earth connection, it is advisable for safety reasons to always keep all poles of the switch earthed on both sides.

During the testing of an electrical circuit breaker, a so-called micro-ohm test is usually performed, in which, with the switching contact or interrupter of the electrical circuit breaker closed, the resistance occurring at the circuit breaker is measured by means of infeed of a predefined current and a voltage is measured by means of the switch, i.e. in the case of several interrupters per phase, by means of all interrupters combined. The predefined current can be several hundred amperes, for example 200 A. Furthermore, during the testing of the electrical circuit breaker, a so-called timing test can be performed, which registers a switching time that is required by the switch in order to execute the switching function command after a control command has been applied. However, if the circuit breaker is earthed on both sides, performing such checks is impractical since earthing on both sides influences the measurements.

SUMMARY

An object of the present invention is therefore to enable safe, accurate and reliable testing of an earthed, multi-pole electrical circuit breaker.

This object is achieved according to the present invention through a method for testing a multi-pole electrical circuit breaker according to claim 1 and a measuring device for testing a multi-pole electrical circuit breaker according to claim 10. The dependent claims define preferred and advantageous embodiments of the invention.

Provided according to the present invention is a method for testing a multi-pole electrical circuit breaker. The multi-pole circuit breaker comprises a plurality of poles. Each of the plurality of poles is assigned to one of a plurality of phases of a multi-phase network and in each case comprises a first connection and a second connection. By closing a particular pole, the first connection of the particular pole can be electrically connected to the second connection of the particular pole by means of one or a plurality of interrupters. The first connection of one of the plurality of poles is connected to an earth potential by means of a grounding cable and the second connection of the particular pole is connected to the earth potential by means of a second grounding cable. The particular pole is thus earthed on both sides. Each further pole of the circuit breaker is either switched in parallel to the particular pole or in parallel to one of the other poles. The other poles are thus also earthed on both sides. In other words, the plurality of poles are not directly earthed on both sides, but rather just one pole is earthed and the other poles are earthed proceeding from said pole. The poles are thus earthed according to the P-P-P-E configuration described above. A sequence, in which the poles are arranged and earthed, is not relevant here. However, for safety reasons, the particular pole should first of all be connected to the earth potential by means of the first and second grounding cable and then the other poles should be switched in parallel one after the other to the particular pole or to one of the other poles. Finally, with this type of earth connection, the first connection of a first pole is directly connected to earth potential by means of the first grounding cable and the first connection of a second pole is connected to the first connection of the first pole by means of a further wire and the first connection of a third pole is connected to the first connection of the second pole by means of yet another wire etc. The same applies to the second connections of the plurality of poles. In the method, a plurality of micro-ohm measurements are carried out at the plurality of poles, while the plurality of poles are earthed on both sides. In each of the plurality of micro-ohm measurements, a current is applied to the first connection of a particular pole, for example, and withdrawn at the second connection of the respective pole. Furthermore, a voltage is measured by means of the first connection and the second connection of the respective pole. Due to the earth connection on both sides, a resistance, which is determined from a quotient of measured voltage and applied current, does not generally correspond to a contact resistance of the relevant pole.

However, a contact resistance can still be determined from one of the plurality of poles on the basis of the plurality of micro-ohm measurements. The plurality of micro-ohm measurements makes it possible to calculate the faults occurring as a result of the earth connection on both sides and thus obtain an accurate measurement of the contact resistances of the individual poles.

The multi-pole circuit breaker can comprise in particular a three-pole circuit breaker with three poles. In the P-P-P-E earth connection configuration described above, a first pole of the three poles is then directly connected to the earth potential by means of the first and second grounding cable, a second pole of the three poles is switched in parallel to the first pole by means of two further wires and a third pole of the three poles is switched in parallel to the second pole by means of two further wires. The micro-ohm measurements can be carried out using two micro-ohm meters, for example, which are simultaneously connected to two of the three poles. A first micro-ohm meter can be connected to the first pole and a second micro-ohm meter can be connected to the third pole, for example. Alternatively, or additionally, the micro-ohm measurements can be carried out using three micro-ohm meters, which are simultaneously connected to the three poles. Each micro-ohm meter can comprise a current source and a voltage measuring device. The current source can have an amperage in the region of several dozen or several hundred amps, for example an amperage of 50 amps, 100 amps or 200 amps. Furthermore, the plurality of micro-ohm meters can have different amperages. A number of micro-ohm measurements can be carried out at the same time or consecutively using the two or three micro-ohm meters. A system of equations can be set up based on the plurality of measurements in which, for example, the resistances of the connections against earth, between the poles as well as those of the closed poles appear as unknown variables. With a suitable equivalent circuit diagram and a sufficient number of measurements, the system can be solved or in the event of overcomplete determination also solved approximately. In particular, the resistances of the closed interrupters of the plurality of poles can also be determined in this manner. By using different amperages, more independent solutions can be set up for the system of equations and consequently the system becomes solvable or, in the case of overcomplete determination, measuring tolerances can be offset.

In a further embodiment, the plurality of micro-ohm measurements are carried out consecutively with different switching position combinations. Preferably, one measurement is taken when all the poles are closed and one when all the poles are open. However, any other combinations are possible. In other words, a first switching position combination is set in which poles of a first group of the plurality of poles are closed and the remaining poles of the plurality of poles are open. In said first switching position combination, several initial micro-ohm measurements are carried out at the plurality of poles wherein the plurality of poles are earthed on both sides as before. A second switching position combination is set subsequently, in which poles of a second group of the plurality of poles are closed and the remaining poles of the plurality of poles are open. The second group is different from the first group. A plurality of micro-ohm measurements are carried out while the plurality of poles are set in the second switching position combination and earthed on both sides. The number of linearly independent solutions for the system of equations can thus be increased to obtain a sufficient number of solutions in order to determine unknown resistances, in particular the contact resistances of the poles. As already mentioned, the plurality of first micro-ohm measurements can be carried out, for example, if all three poles are closed and the plurality of second micro-ohm measurements can be carried out if all three poles are open. Thus, systems of equations can be set up that are particularly easy to solve. Furthermore, the poles can be controlled automatically by a suitable control system and consequently testing can be done automatically.

In a further embodiment, the plurality of micro-ohm measurements are carried out at the plurality of poles such that a respective micro-ohm meter is connected to the first connection and the second connection of a respective pole. Preferably, the current source and the voltage measuring device of a particular micro-ohm meter are placed precisely on the nodes of the earth connections, i.e. on the first connection and the second connection of the particular pole by means of a four-wire measurement so that the systems of equations to be solved are as simple as possible. The contact resistances of the poles as well as the resistances of the connections between the poles or between pole and earth then occur substantially as unknown resistance variables.

In a further embodiment, one or more poles are open or closed when the plurality of micro-ohm measurements are carried out and a chronological sequence of current and voltage recorded during the opening and closing of the pole. A chronological sequence of the contact resistance of the pole is determined on the basis of the recorded chronological sequence of current and voltage. If the micro-ohm meters are able to carry out time measurements at the pole, a micro-ohm measurement, a switching time measurement and a dynamic resistance measurement can be carried out without rewiring the earth connections and the measuring setup. The circuit breaker can thus be checked comprehensively in a short period of time.

Furthermore, according to the present invention, a measuring device is provided for testing a multi-pole electrical circuit breaker, in particular a three-pole circuit breaker. The multi-pole circuit breaker comprises a plurality of poles, wherein each of the plurality of poles is assigned to one of a plurality of phases of a multi-phase network and comprises a first connection and a second connection. By closing a particular pole, the first connection of the particular pole can be electrically connected to the second connection of the particular pole. The first connection of one of the plurality of poles is connected to an earth potential by means of a first grounding cable and the second connection of the particular pole is connected to the earth potential by means of a second grounding cable. The particular pole is thus earthed on both sides. Each further pole of the plurality of poles is either switched in parallel to the particular pole or in parallel to one of the other poles using additional connecting wires. The other poles are thus also earthed on both sides. Overall, the poles of the multi-pole electrical circuit breaker are thus earthed in a P-P-P-E configuration. The measuring device comprises a micro-ohm measuring device for carrying out a plurality of micro-ohm measurements at the plurality of poles while the plurality of poles are earthed on both sides at the first and second connection. The plurality of micro-ohm measurements are carried out at the first connection and the second connection of a respective pole. In each of the plurality of micro-ohm measurements, a current can be applied to the first connection of the particular pole for this purpose, for example and withdrawn at the second connection of the respective pole. Moreover, a voltage can be recorded between the first connection and the second connection of the particular pole. Due to the earthing on both sides, a resistance, which is determined from a quotient of measured voltage and applied current, does not generally correspond to a contact resistance of the relevant pole. The micro-ohm measuring device can comprise a plurality of micro-ohm meters, for example, which are connected simultaneously to different poles in the plurality of poles. Alternatively, the micro-ohm measuring device can comprise just one micro-ohm meter, which is connected consecutively to different poles of the plurality of poles. The measuring device also comprises a processing device, which is able to determine a contact resistance of a pole on the basis of the plurality of micro-ohm measurements. In particular, the processing device may be able to solve a linear system of equations or even an overdetermined linear system of equations, which is defined by the micro-ohm measurements determined using the micro-ohm measuring device and shows the contact resistances of the plurality of poles as unknown. Furthermore, the processing device can be designed to issue operating instructions to an operator via a user interface, for example, for carrying out the micro-ohm measurements and connecting the micro-ohm meter. Moreover, the processing device can have an interface for controlling the circuit breaker, in order to switch the circuit breaker or individual poles of the circuit breaker selectively into an open or closed state for the purpose of carrying out micro-ohm measurements under these conditions.

The measuring device is thus designed to implement the method described above for testing a multi-pole electrical circuit breaker and therefore also includes the advantages described above in connection with the method.

Although the special features described in the summary above were described in connection with special embodiments, it is clear that the features of the embodiments described can be combined in an arbitrary manner.

The present invention is explained in detail below with reference to the drawings.

DETAILED DESCRIPTION

Figure 1:
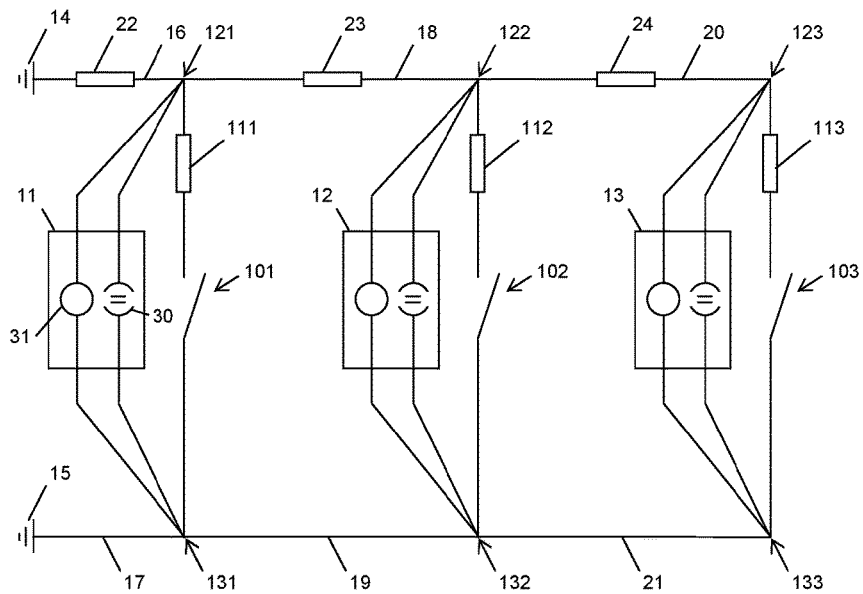
FIG. 1 shows a schematic view of a measuring device according to an embodiment of the present invention in conjunction with a three-pole circuit breaker.

FIG. 1 shows a three-pole electrical circuit breaker, which comprises three poles 101-103 for switching three phases of a three-phase current. The first pole 101 switches a first of the three phases, the second pole 102 switches a second of the three phases and the third pole 103 switches a third of the three phases. Each of the poles 101-103 comprises a first connection 121-123 and a second connection 131-133 for connecting three-phase current transmission wires, as well as one or more switching contacts, so-called interrupters or interruption units, switched in series which can be selectively closed or open. By closing a particular pole 101-103, the first connection of the particular pole is electrically connected to the second connection of the particular pole. Thus, by closing the pole 101, the first connection 121 is electrically connected to the second connection 131. Also by closing the pole 102, the first connection 122 is electrically connected to the second connection 132 and by closing the pole 103, the first connection 123 is electrically connected to the second connection 133. The three poles 101-103 can be switched with the aid of a suitable power unit, for example, simultaneously or separately from each other. In a closed state, each of the poles 101-103 has a contact resistance which is shown as resistance 111, 112 and 113 respectively in the schematic view in FIG. 1. The resistance 111 thus represents the contact resistance of the pole 101, the resistance 112 represents the contact resistance of the pole 102 and the resistance 113 represents the contact resistance of the pole 103.

Figure 2:
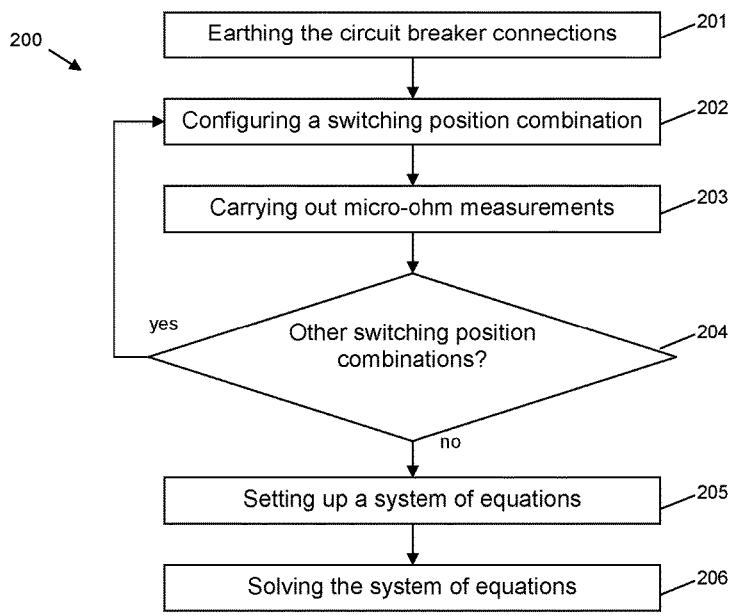
FIG. 2 shows a method for testing a multi-pole electrical circuit breaker according to an embodiment of the present invention.

When testing the circuit breaker, the contact resistances 111-113 of the poles 101-103 are checked. Each of the poles 101-103 should have a very small contact resistance in the closed state in order not to heat up excessively during operation and in order to conduct safely and not overheat in the event of a fault current into which some ten kA can flow. Testing the poles 101-103 is described in detail below with reference to a method 200 which is shown in FIG. 2.

When testing a circuit breaker, firstly the poles 101-103 are opened and the entire circuit breaker is separated from the rest of the system, from power transmission wires, for example, by means of separators. The three poles 101-103 are then earthed on both sides in step 201. The first connections 121-123 and the second connections 131-133 are connected to earth potential for this purpose. The earth potential is labelled with the reference numerals 14 and 15 in FIG. 1. A conventional earthing diagram is the P-P-P-E earth connection in which a first phase is connected with earth potential on both sides, a second phase is switched in parallel to the first phase and a third phase is switched in parallel to the second phase. A P-P-P-E earthing diagram of this type is shown in FIG. 1. The first connection 121 of the first pole 101 of the first phase is connected directly to earth potential 14 by means of a first grounding cable 16. The second connection 131 of the first pole 101 is connected directly to earth potential 15 by means of a second grounding cable 17. The resistance of the first and second grounding cable 16, 17 is symbolised by a resistance 22. Alternatively, two resistances could be shown symbolically, one for each grounding cable 16, 17. However, since, as will be shown below, from the point of view of a micro-ohm measurement, the resistances of the grounding cable 16, 17 lie in series anyway, the overall resistance of the grounding cable 16, 17 can be shown symbolically by the resistance 22. The first connection 122 of the second pole 102 is connected to the first connection 121 of the first pole 101 by means of a wire 18. The second connection 123 of the second pole 102 is connected to the second connection 131 of the first pole 101 by means of a wire 19. Thus, the second pole 102 is switched in parallel to the first pole 101. The combined resistance of the cable 18, 19 is shown symbolically as an alternative in FIG. 1 by the resistance 23. The third pole 103 is switched in parallel to the second pole 102 by means of the wire 20, 21. In other words, the first connection 123 of the third pole 103 is connected to the first connection 122 of the second pole 102 by means of the wire 20 and the second connection 133 of the third pole 103 is connected to the second connection 132 of the second pole 102 by means of the wire 21. The connections by means of the wires 18-21 each represent direct connections between the connections 121-123 and 131-133 respectively. An overall resistance of the wires 20, 21 is shown symbolically in FIG. 1 by the resistance 24. An overall resistance of the wires 18, 19 is shown symbolically in FIG. 1 by the resistance 23.

Alternatively, the three poles 101-103 can also be earthed in a so-called P-P-P-E earth connection. Here, the first connection 121 of the first pole 101 is connected directly to earth potential and the second connection 133 of the third pole 103 is connected directly to earth potential. The other first connections 122 and 123 are connected to the first connection 121 of the first pole 101 as described above and the other second connections 131 and 132 are connected to the second connection 133 of the third pole 103 as described above.

A measuring device, which comprises three micro-ohm meters 11, 12, 13 is now connected to the poles 101-103. Each micro-ohm meter 11-13 comprises a current source 30 and a voltage measuring device 31, for example, a voltmeter. In FIG. 1, the current source 30 and the voltage measuring device 31 are only provided with reference numerals for the micro-ohm measuring device 11. However, the micro-ohm measuring devices 12 and 13 comprise comparable current sources and voltage measuring devices. The micro-ohm meter 11 is connected to the first connection 121 and the second connection 131 of the first pole 101 by means of a four-wire connection. Influences by the lead wires between the first and second connections 121, 131 and the micro-ohm measuring device 11 can thus be avoided. The second micro-ohm meter 12 is also connected to the first connection 122 and the second connection 132 of the second pole 102 by means of a four-wire connection. The third micro-ohm meter 13 is connected to the first connection 123 and the second connection 133 of the third pole 103 by means of a four-wire connection. Alternatively, the current source 30 and the voltage measuring device 31 can also be connected at different points of the respective pole 101-103, whereby, however, a resulting system of equations becomes more complex as unknown resistances between said points would also have to be considered.

In step 202, a combination of switching positions of the poles 101-103 is now set. In step 203, micro-ohm measurements are carried out using the micro-ohm meters 11-13. This is repeated for a specific number of switching position combinations. For example, the micro-ohm measurements can be carried out once in step 203 while all three poles 101-103 are open and one more time while all three poles 101-103 are closed. A check is made in step 204 whether all required switching position combinations have been set and corresponding micro-ohm measurements carried out. Further combinations in which only one or two of the poles 101-103 are closed can also be implemented. The resistance network with unknown resistances 22-24 and 111-113 shown in FIG. 1 can be solved with the aid of the currents applied and voltages measured using the micro-ohm meters 11-13, for example by applying Kirschhoff's laws. In step 205, a linear system of equations can be set up with the unknown resistances 22-24 and 111-113, for example, and said system of equations can be solved in step 206.

Based on the number of measurements carried out in step 203, the system of equations set up in step 205 can even be overdetermined. In this case, the unknown resistances 22-24 and 111-113 can be determined approximately, wherein, however, said approximate solutions are extremely accurate as measuring tolerances can be offset. Moreover, the micro-ohm meters 11-13 can work with different currents, for example with 50, 100 or 200 amperes of direct current. The different currents produce different ratios which offer further options for providing solutions to the system of equations.

The four-wire connections to the first and second connections 121-123 and 131-133 respectively, shown in FIG. 1, provide a four-wire measurement and should be arranged as accurately as possible at the nodes of the connections so that the systems of equations to be solved are as simple as possible.

Moreover, the micro-ohm meters can be configured such that they carry out time measurements at the poles 101-103 assigned to them. A micro-ohm measurement and a circuit time measurement as well as a dynamic resistance measurement can thus be carried out without rewiring the earth connection and the measuring setup.

The invention claimed is:

1. Method for testing a multi-pole electrical circuit breaker, wherein the multi-pole circuit breaker comprises a three-pole circuit-breaker having three poles wherein each of the plurality of poles comprises a first connection and a second connection, wherein closing a respective pole of the plurality of poles makes it possible to electrically connect the first connection of the respective pole to the second connection of the respective pole, wherein the first connection of one of the plurality of poles is connected to an earth potential by means of a first grounding cable and the second connection of the one pole is connected to the earth potential by means of a second grounding cable, and wherein each further pole of the plurality of poles is either switched in parallel to the one pole or in parallel to one of the other poles, wherein the method comprises:
  carrying out a plurality of micro-ohm measurements at the plurality of poles while the plurality of poles are grounded on both sides, and
  determining a contact resistance of one of the plurality of poles on the basis of the plurality of micro-ohm measurements, wherein the micro-ohm measurements are carried out using two micro-ohm meters which are connected simultaneously to two of the three poles.

2. Method according to claim 1, wherein a current is applied to the first connection of a respective pole of the plurality of poles with each of the plurality of micro-ohm measurements, and the current at the second connection of the respective pole is withdrawn and a voltage is measured between the first connection of the respective pole and the second connection of the respective pole.

3. Method according to claim 1, wherein the multi-pole circuit breaker comprises a multi-pole circuit breaker having three poles, wherein the micro-ohm measurements are carried out using three micro-ohm meters which are connected simultaneously to the three poles.

4. Method according to claim 1, wherein each micro-ohm meter comprises a current source and a voltage measuring device.

5. Method according to claim 4, wherein an amperage of the current source of a first of the micro-ohm meters and an amperage of the current source of a second of the micro-ohm meters are different.

6. Method according to claim 1, wherein carrying out the plurality of micro-ohm measurements comprises:
  setting a first switching position combination, wherein, in a first switching position combination, poles of a first group of the plurality of poles are closed and the remaining poles of the plurality of poles are open,
  carrying out a plurality of first micro-ohm measurements at the plurality of poles while the plurality of poles are set in the first switching position combination and are grounded on both sides,
  setting a second switching position combination, wherein, in the second switching position combination, poles of a second group of the plurality of poles are closed and the remaining poles of the plurality of poles are open, wherein the second group is different from the first group, and
  carrying out a plurality of second micro-ohm measurements at the plurality of poles while the plurality of poles are set in the second switching position combination and are grounded on both sides.

7. Method according to claim 1, wherein carrying out the plurality of micro-ohm measurements at the plurality of poles comprises:
connecting a respective micro-ohm meter to the first connection and the second connection of a respective pole of the plurality of poles.

8. Method according to claim 1, wherein carrying out the plurality of micro-ohm measurements comprises:
opening or closing a pole of the plurality of poles, and
detecting a chronological sequence of the micro-ohm measurement while opening or closing the pole, and
determining a chronological sequence of the contact resistance of the pole on the basis of the detected chronological sequence of the micro-ohm measurement.

9. Measuring device for testing a multi-pole electrical circuit breaker, wherein the multi-pole circuit breaker comprises a three-pole circuit-breaker having three poles wherein each of the poles comprises a first connection and a second connection, wherein closing a respective pole of the three poles makes it possible to electrically connect the first connection of the respective pole to the second connection of the respective pole, wherein the measuring device comprises:
a first grounding cable for connecting the first connection of a selected one of the three poles to an earth potential, and
a second grounding cable for connecting the second connection of the selected one of the three poles to the earth potential, and
further connecting cables for switching of each other pole of the three poles either in parallel to the selected one of the three poles or in parallel to one of the other poles,
a micro-ohm measuring device for carrying out a plurality of micro-ohm measurements at the three of poles while the poles are grounded on both sides, wherein the micro-ohm measurements are carried out using two micro-ohm meters which are connected simultaneously to two of the three poles, and
a processing device, which is designed to determine a contact resistance of one of the poles on the basis of the micro-ohm measurements.

10. Method for testing a multi-pole electrical circuit breaker, wherein the multi-pole circuit breaker comprises a plurality of poles, wherein each of the plurality of poles comprises a first connection and a second connection, wherein closing a respective pole of the plurality of poles makes it possible to electrically connect the first connection of the respective pole to the second connection of the respective pole, wherein the first connection of one of the plurality of poles is connected to an earth potential by means of a first grounding cable and the second connection of the one pole is connected to the earth potential by means of a second grounding cable, and wherein each further pole of the plurality of poles is either switched in parallel to the one pole or in parallel to one of the other poles, wherein the method further comprises:
carrying out a plurality of micro-ohm measurements at the plurality of poles while the plurality of poles are grounded on both sides using a plurality of micro-ohm meters which are simultaneously connected to at least two of the plurality of poles of the multi-pole circuit breaker, wherein each of the plurality of micro-ohm meters comprises a current source and a voltage measuring device, and wherein an amperage of the current source of a first of the plurality of micro-ohm meters is different from an amperage of the current source of a second of the plurality of micro-ohm meters; and
determining a contact resistance of one of the plurality of poles on the basis of the plurality of micro-ohm measurements.

11. Measuring device for testing a multi-pole electrical circuit breaker, wherein the multi-pole circuit breaker comprises a plurality of poles, wherein each of the plurality of poles comprises a first connection and a second connection, wherein closing a respective pole of the plurality of poles makes it possible to electrically connect the first connection of the respective pole to the second connection of the respective pole, wherein the first connection of one of the plurality of poles is connected to an earth potential by means of a first grounding cable and the second connection of the one pole is connected to the earth potential by means of a second grounding cable, and wherein each further pole of the plurality of poles is either switched in parallel to the one pole or in parallel to one of the other poles,
wherein the measuring device further comprises a micro-ohm measuring device carrying out a plurality of micro-ohm measurements at the plurality of poles while the plurality of poles are grounded on both sides using a plurality of micro-ohm meters which are simultaneously connected to at least two of the plurality of poles of the multi-pole circuit breaker, wherein each of the plurality of micro-ohm meters comprises a current source and a voltage measuring device, and wherein an amperage of the current source of a first of the plurality of micro-ohm meters is different from an amperage of the current source of a second of the plurality of micro-ohm meters, and
a processing device, which is designed to determine a contact resistance of one of the plurality of poles on the basis of the plurality of micro-ohm measurements.

* * * * *